(12) United States Patent
Song et al.

(10) Patent No.: US 11,683,031 B1
(45) Date of Patent: Jun. 20, 2023

(54) THYRISTOR CURRENT INTERRUPTER

(71) Applicant: ABB Schweiz AG, Baden (CH)

(72) Inventors: Xiaoqing Song, Apex, NC (US); Yuzhi Zhang, Apex, NC (US); Thomas Kendzia, III, Richmond, VA (US); Yu Du, Pleasanton, CA (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/560,551

(22) Filed: Dec. 23, 2021

(51) Int. Cl.
*H03K 17/13* (2006.01)
*H03K 17/60* (2006.01)
*H03K 17/04* (2006.01)
*H03K 17/06* (2006.01)

(52) U.S. Cl.
CPC ....... *H03K 17/136* (2013.01); *H03K 17/0403* (2013.01); *H03K 17/06* (2013.01); *H03K 17/60* (2013.01)

(58) Field of Classification Search
CPC .. H03K 17/136; H03K 17/0403; H03K 17/06; H03K 17/60
See application file for complete search history.

(56) References Cited

U.S. PATENT DOCUMENTS

| | | | |
|---|---|---|---|
| 5,814,904 A | 9/1998 | Galm | |
| 7,459,804 B2 | 12/2008 | Marwali et al. | |
| 7,589,438 B2 | 9/2009 | Galm | |
| 8,508,890 B2 | 8/2013 | Zheng et al. | |
| 11,018,666 B1 | 5/2021 | Du et al. | |
| 2017/0040999 A1 | 2/2017 | Schneider | |
| 2018/0091137 A1* | 3/2018 | Schneider | ........... H02M 7/5152 |
| 2021/0028621 A1 | 1/2021 | Oudrhiri | |

FOREIGN PATENT DOCUMENTS

WO 2021167842 A1 8/2021
WO WO-2022125094 A1 * 6/2022

OTHER PUBLICATIONS

Yanxun Guo et al., "A Thyristor Full-Bridge-Based DC Circuit Breaker", IEEE Transactions on Power Electronics, vol. 35, No. 1, Jan. 2020, pp. 1111-1123.

(Continued)

*Primary Examiner* — Daniel C Puentes
(74) *Attorney, Agent, or Firm* — Armstrong Teasdale LLP

(57) ABSTRACT

In one aspect, a solid-state switching apparatus is provided that includes a pair of anti-parallel thyristors, a quasi-resonant turn-off circuit, a sensor, and a control circuit. The turn-off circuit is coupled in parallel with the pair of anti-parallel thyristors and includes a first selectively conductive path and a second selectively conductive path. The sensor is configured to sense a thyristor current conducted by at least one of the pair of anti-parallel thyristors. The control circuit is configured to receive the sensed thyristor current from the sensor and determine a magnitude of the sensed thyristor current and a polarity of the sensed thyristor current. The control circuit is further configured to activate, in response to determining that the magnitude is greater than a threshold value, one of the first selectively conductive path and the second selectively conductive path based on the polarity to commutate and interrupt the thyristor current.

20 Claims, 7 Drawing Sheets

(56) References Cited

OTHER PUBLICATIONS

Christoph Meyer et al., "Solid-State Circuit Breaker Based on Active Thyristor Topologies", IEEE Transactions on Power Electronics, vol. 21, No. 2, Mar. 2006, pp. 450-458.
Po-Tai Cheng et al., "Design of an Impulse Communication Bridge for the Solid-State Transfer Switch", IEEE Transactions on Industry Applications, vol. 44, No. 4, Jul./Aug. 2008, pp. 1249-1258.
International Search Report and Written Opinion for International Application No. PCT/US2022/081245, dated Apr. 5, 2023, 20 pages.

* cited by examiner

THYRISTOR CURRENT INTERRUPTER

BACKGROUND

The field of the disclosure generally relates to solid-state switches, and more particularly, to controlling turn-off in thyristors.

Thyristors (also referred to as Silicon Controlled Rectifiers (SCRs)) are power semiconductor devices that are widely used in power applications. Thyristors provide a high current capacity in a single package, provide low conduction power loss, have a proven reliability, and are widely available at a low cost. However, one major disadvantage of thyristors is they lack controlled turn-off or current interruption capability. Turning off thyristors entails waiting for a zero-crossing current before they can be switched off. Therefore, thyristors cannot actively interrupt a current when the gate control current is removed. During an overcurrent fault, the wait for turn-off may allow the fault current to rise to relatively high levels, potentially damaging equipment.

In addition to traditional applications such as circuit breakers and Direct Current (DC) contactors which implement current interruption, the thyristor switch with an add-on current turn-off capability can also improve the performance of a Static Transfer Switch (STS) and micro-grid disconnect switch where thyristors are used as main power switches. A Typical STS utilizes a "break-before-make" approach for power source transfer when the STS detects a power quality event, and the disconnection time associated to turn off active thyristors is a significant part of the total transfer time. As a result, the transfer gap between turning off the active thyristors and turning on the inactive thyristors can sometimes be a full electrical cycle period. This long gap may impact the power quality at downstream loads.

Micro-grid disconnect switches connect micro-grids with distributed generation such as photovoltaic farms, windmills, energy storage systems, and diesel generators to the utility grid. In the case of a power outage, the distributed generation continues to power the micro-grid and the disconnect switch is used to isolate the micro-grid immediately from the utility grid. Traditional thyristors can only disconnect micro-grids after a waiting period for a current zero-crossing.

Thus, it is desirable to improve the turn-off time for thyristors in order to improve their performance and use in a wide variety of solid-state switching applications.

BRIEF DESCRIPTION

In one aspect, a solid-state switching apparatus is provided. The solid-state switching apparatus includes a pair of anti-parallel thyristors, a quasi-resonant turn-off circuit, a sensor, and a control circuit. The quasi-resonant turn-off circuit is coupled in parallel with the pair of anti-parallel thyristors, and the quasi-resonant turn-off circuit includes a first selectively conductive path and a second selectively conductive path. The sensor is configured to sense a thyristor current conducted by at least one of the pair of anti-parallel thyristors. The control circuit is configured to receive the sensed thyristor current from the sensor and determine a magnitude of the sensed thyristor current and a polarity of the sensed thyristor current. The control circuit is further configured to activate, in response to determining that the magnitude is greater than a threshold value, one of the first selectively conductive path and the second selectively conductive path based on the polarity to commutate and interrupt the thyristor current.

In another aspect, a method of operating a solid-state switching apparatus is provided. The method includes sensing a thyristor current conducted by at least one of a pair of anti-parallel thyristors, where the pair of anti-parallel thyristors are coupled in parallel with a quasi-resonant turn-off circuit and where the quasi-resonant turn-off circuit includes a first selectively conductive path and a second selectively conductive path. The method further includes determining a magnitude of the sensed thyristor current and a polarity of the sensed thyristor current, and activating, in response to determining that the magnitude is greater than a threshold value, one of the first selectively conductive path and the second selectively conductive path based on the polarity to commutate and interrupt the thyristor current.

In another aspect, a solid-state switching apparatus is provided. The solid-state switching apparatus includes a first thyristor, a second thyristor, a quasi-resonant turn-off circuit, a sensor, and a control circuit. The first thyristor selectively couples a source with a load to conduct a load current. The second thyristor is anti-parallel to the first thyristor, and the second thyristor selectively couples the source with the load to conduct the load current. The quasi-resonant turn-off circuit is coupled in parallel with the first thyristor and the second thyristor, and the quasi-resonant turn-off circuit includes a first selectively conductive path and a second selectively conductive path. The first selectively conductive path is configured to commutate and interrupt the load current when the load current is conducted by the first thyristor, and the second selectively conductive path is configured to commutate and interrupt the load current when the load current is conducted by the second thyristor. The control circuit is configured to determine, using the sensor, a magnitude of the load current and a polarity of the load current. In response to determining that the magnitude of the load current is greater than a threshold value, the control circuit activates, in response to the polarity of the load current being positive, the first selectively conductive path to commutate and interrupt the load current conducted by the first thyristor, and activates, in response to the polarity of the load current being negative, the second selectively conductive path to commutate and interrupt the load current conducted by the second thyristor.

DRAWINGS

These and other features, aspects, and advantages of the present disclosure will become better understood when the following detailed description is read with reference to the accompanying drawings in which like characters represent like parts throughout the drawings, wherein.

Figure 1:
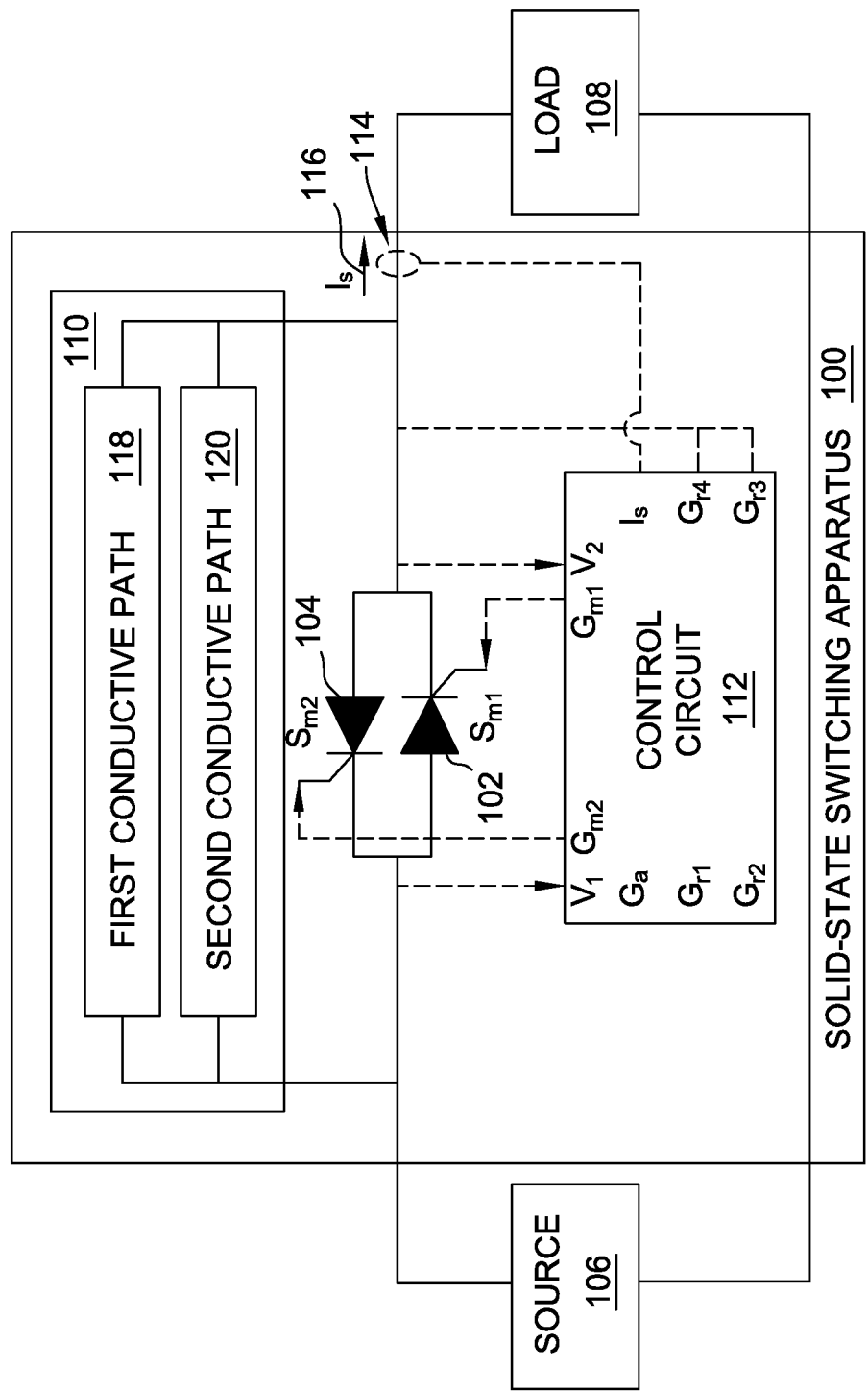
FIG. 1 depicts a solid-state switching apparatus in an example embodiment.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

FIG. 1 depicts a solid-state switching apparatus 100 in an example embodiment. In this embodiment, switching apparatus 100 includes a pair of anti-parallel thyristors 102 ($S_{m1}$), 104 ($S_{m2}$) that selectively couple a source 106 with a load 108, a quasi-resonant turn-off circuit 110 in parallel with thyristors 102, 104, a control circuit 112, and a current sensor 114 that senses a current 116 ($I_s$) between source 106 and load 108.

Turn-off circuit 110 includes any component, system, or device that accelerates the turn-off time for thyristors 102, 104 by interrupting the current through thyristors 102, 104. When switching apparatus 100 is operated to interrupt the current between source 106 and load 108, turn-off circuit 110 is activated to commutate the current flowing through thyristors 102, 104 to turn-off circuit 110, which decreases the current flowing through thyristors 102, 104. Commutating the current from thyristors 102, 104 to turn-off circuit 110 decreases the current level in thyristors 102, 104 quickly to zero or to a level below the holding current for thyristors 102, 104, in a relatively short time (e.g., less than about 20 microseconds). In addition, turn-off circuit 110 can apply a reverse bias voltage to thyristors 102, 104 (e.g., from about 30 Volts to about 50 Volts) to reduce the turn-off time of thyristors 102, 104. Although the duration of the application of the reverse bias voltage applied to thyristors 102, 104 can vary depending the application, the duration may vary from about 150 microseconds to about 200 microseconds in some embodiments. Following the application of the reverse bias voltage to thyristors 102, 104, thyristors 102, 104 will be in condition to be deactivated or turned off. Turn-off circuit 110 can then be deactivated, thereby completing the disconnection of source 106 from load 108. In this embodiment, turn-off circuit 110 includes a first selectively conductive path 118, which is activated to commutate the current flowing through thyristor 102, and a second selectively conductive path 120, which is activated to commutate the current flowing through thyristor 104.

Control circuit 112 includes any component, system, or device that controls the operation of switching apparatus 100. In particular, control circuit 112 generates gate control signals $G_{m1}$, $G_{m2}$ to control the operation of thyristors 102, 104, respectively. Control circuit 112 utilizes current sensor 114 to measure a magnitude and polarity of current 116, which is used by control circuit 112 to determine which of thyristors 102, 104 are conducting current 116 and therefore, which of first path 118 of turn-off circuit or second path 120 of turn-off circuit 110 to activate when switching apparatus 100 is tasked with disconnecting source 106 from load 108. Control circuit 112, in some embodiments, measures a differential voltage across thyristors 102, 104 (e.g., using input voltage signals $V_1$ at source 106 side of thyristors 102, 104 and $V_2$ at load 108 side of thyristors 102, 104).

Current sensor 114 includes any component, system, or device that senses current 116 and provides information to control circuit 112 that allows control circuit 112 to determine the magnitude and polarity of current 116.

Figure 2:
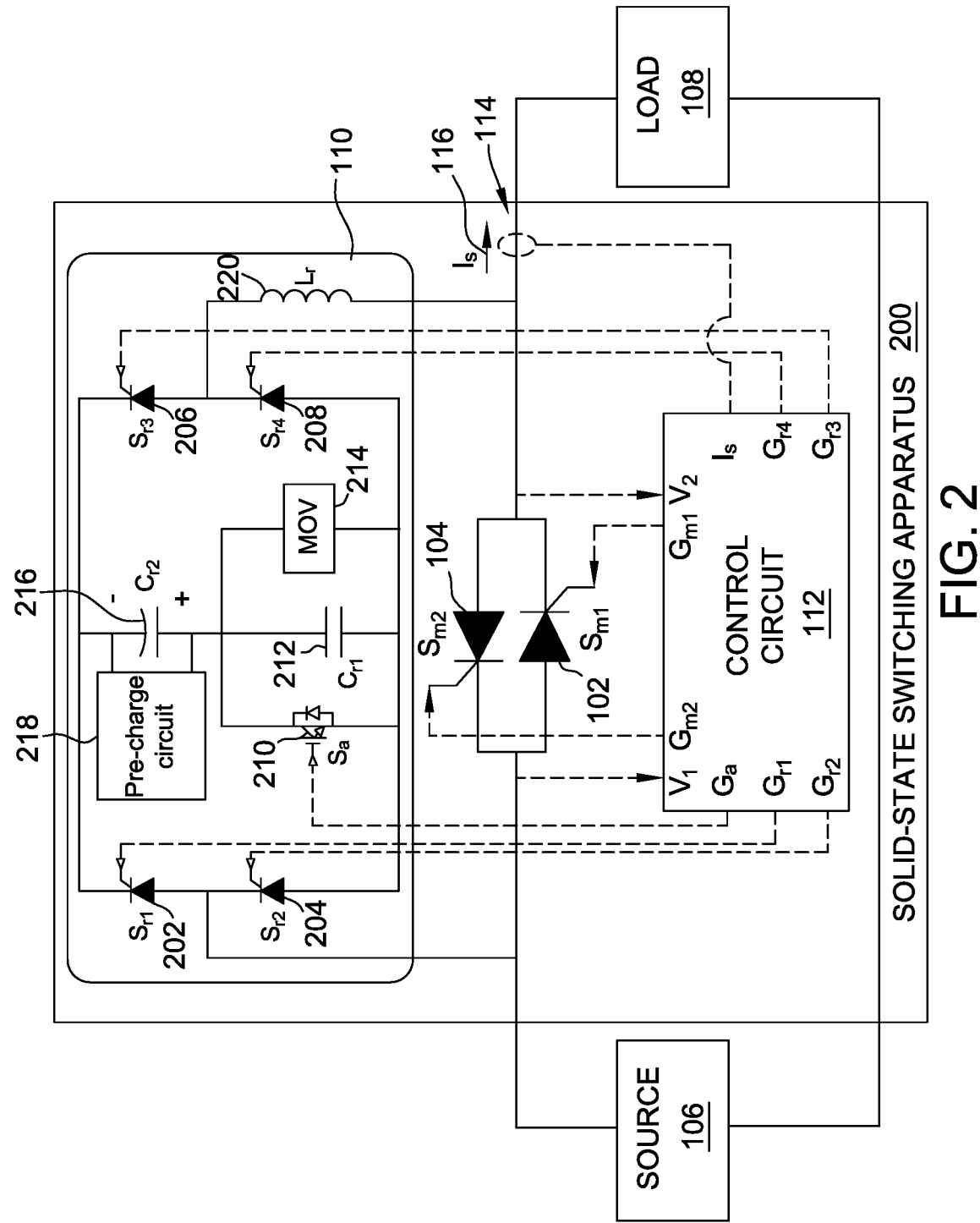
FIG. 2 depicts another solid-state switching apparatus in an example embodiment.

FIG. 2 depicts another solid-state switching apparatus 200 in an example embodiment. In this embodiment, turn-off circuit 110 includes auxiliary thyristors 202 ($S_{r1}$), 204 ($S_{r2}$), 206 ($S_{r3}$), 208 ($S_{r4}$) that provides turn-off circuit 110 a reconfigurable bridge that varies depending on the direction of current 116. When a turn-off process occurs at switching apparatus 200 to disconnect source 106 from load 108 during a positive half-cycle for current 116, auxiliary thyristors 202, 208 are forward biased to commutate the current away from thyristor 102 to turn-off circuit 110. When a turn-off process occurs at switching apparatus 200 to disconnect source 106 from load 108 during a negative half-cycle for current 116, auxiliary thyristors 204, 206 are forward biased to commutate current 116 away from thyristor 104 to turn-off circuit 110. In this embodiment, auxiliary thyristors 202, 208 form part of first path 118 of turn-off circuit 110 (see FIG. 1) and auxiliary thyristors 204, 206 form part of second path 120 of turn-off circuit 110 (see FIG. 1).

In the embodiment of FIG. 2, turn-off circuit 110 further includes an auxiliary transistor 210 ($S_a$), illustrated as an Insulated Gate Bipolar Transistor (IGBT) in FIG. 2, although auxiliary transistor 210 may include other types of devices in other embodiments. Turn-off circuit 110 further includes a first resonant capacitor 212 ($C_{r1}$) in parallel with auxiliary transistor 210 and a snubber 214 in parallel with first resonant capacitor 212 and auxiliary transistor 210. Snubber 214 may include any type of circuit used as a transient voltage clamp, including a Metal Oxide Varistor (MOV). Turn-off circuit 110 in this embodiment further includes a second resonant capacitor 216 ($C_{r2}$) in series with the parallel combination of auxiliary transistor 210, first resonant capacitor 212, and snubber 214. In some embodiments, turn-off circuit 110 includes a pre-charge circuit 218 in parallel with second resonant capacitor 216. Pre-charge circuit 218 is used to charge second resonant capacitor 216 ($C_{r2}$) to a voltage (e.g., from about 30 Volts to about 50 Volts), which is used to apply a reverse bias voltage to thyristors 102, 104 during turn-off of thyristors 102, 104. A resonant inductor 220 ($L_r$) has a first terminal coupled between the cathode of auxiliary thyristor 208 and the anode of auxiliary thyristor 206, and a second terminal coupled to load 108 side of thyristors 102, 104. Resonant inductor 220 may include the parasitic inductance in the connections between turn-off circuit 110 and load 108 and/or thyristors 102, 104.

In turn-off circuit 110 of FIG. 2, second resonant capacitor 216, in some embodiments, is pre-charged (e.g., via pre-charge circuit 218) to a relatively low voltage and provides a resonant current to create a zero-crossing current for thyristors 102, 104. Second resonant capacitor 216, in some embodiments, also provides a reverse bias voltage through auxiliary transistor 210 for thyristors 102, 104 after current 116 has been commutated away from thyristors 102, 104 through turn-off circuit 110, providing time for thyristors 102, 104 to finish an internal carrier recombination process to enable thyristors 102, 104 to turn off. Auxiliary transistor 210 is turned off, and current 116 is commutated from auxiliary transistor 210 to first resonant capacitor 212. First resonant capacitor 212 limits the rate of voltage change (dv/dt) of thyristors 102, 104 to prevent thyristors 102, 104 from being triggered back on. When the voltage of first resonant capacitor 212 reaches a significant level, including, for example, a level at which first resonant capacitor 212 is limited by snubber 214, current 116 is decreased to zero or interrupted. Auxiliary thyristors 202, 204, 206, 208 are turned off by control circuit 112, which completes the turn-off process of switching apparatus 200. In some embodiments, the total time to interrupt current 116 during a turn-off process for switching apparatus 200 is less than about 350 microseconds.

Figure 3:
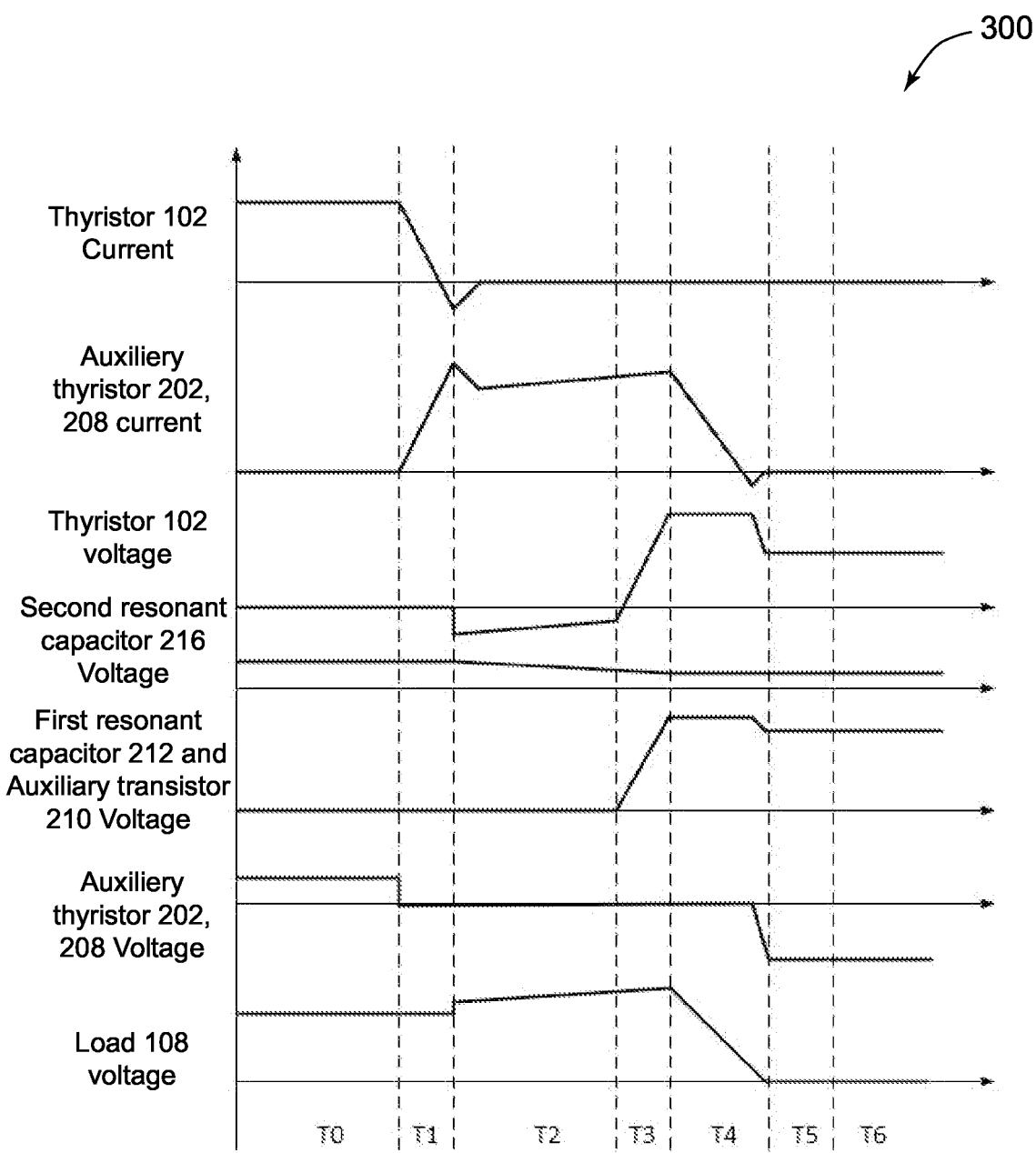
FIG. 3 depicts waveforms of currents and voltages for the solid-state switching apparatus of FIG. 2 in an example embodiment.

FIG. 3 depicts waveforms 300 of currents and voltages for switching apparatus 200 and a voltage of load 108 during a turn-off process in an example embodiment. In particular, waveforms 300 depicts the current and voltages for switching apparatus 200 and the voltage of load 108 during a positive half-cycle for current 116 when thyristor 102 is conducting, although the discussion is similar to when current 116 is negative and thyristor 104 is conducting, with the differences generally being which of auxiliary thyristors 202, 204, 206, 208 are conducting.

During an initial time period T0 depicted in FIG. 3, thyristor 102 is conducting (e.g., current 116 has a positive non-zero value), and turn-off circuit 110 is off (e.g., auxiliary thyristors 202, 204, 206, 208, and auxiliary transistor 210 are off). At the end of time period T0, control circuit 112 receives a turn-off command to disconnect source 106 from load 108, and control circuit 112 at T1 turns on auxiliary thyristors 202, 208 and auxiliary transistor 210 in order to commutate current 116 flowing through thyristor 102 to turn-off circuit 110. T1 defines a first resonance period of the turn-off process. As depicted in FIG. 3, current through thyristor 102 is decreasing and current through auxiliary thyristors 202, 208 are increasing. During the time period T1, resonance starts between second resonant capacitor 216 and resonant inductor 220, and resonant current flows through auxiliary thyristor 202, second resonant capacitor 216, auxiliary transistor 210, auxiliary thyristor 208, and resonant inductor 220.

Resonant inductor 220 may be used to limit the rate of change (di/dt) of the resonant current flowing through resonant inductor 220 to provide a soft commutation of thyristor 102. During the time period T1, thyristor 102 exhibits a zero-crossing current as the resonant current through second resonant capacitor 216 rises. Also, during the time period T1, a reverse recovery current may be associated with thyristor 102, depicted as the negative transition in FIG. 3 for the current through thyristor 102, which allows some carrier recombination to occur within thyristor 102. Some charges may remain trapped within thyristor 102 however, so the time period T2 is used to complete the carrier recombination within thyristor 102 as second resonant capacitor 216 applies a reverse bias voltage to thyristor 102. In this regard, the time period T2 may be adjusted in some embodiments to ensure that carrier recombination within thyristor 102 is completed. Also, during the time period T2, current 116 is fully commutated away from thyristor 102 and is carried by turn-off circuit 110 through the first path 118 formed by auxiliary thyristor 202, second resonant capacitor 216, auxiliary transistor 210, auxiliary thyristor 208, and resonant inductor 220.

At the end of the time period T2, auxiliary transistor 210 is turned off and current 116 is commutated to first resonant capacitor 212. The voltage across auxiliary transistor 210 and first resonant capacitor 212 rises, with the time period T3 defining a second resonance period in the turn-off process. During the time period T3, first resonant capacitor 212 limits the rate of voltage rise (dv/dt) across thyristor 102, in order to prevent a high dv/dt across thyristor 102 from triggering thyristor 102 to turn back on. Depending on the magnitude of current 116, the voltage across first resonant capacitor 212 may trigger snubber 214 near the end of the time period T3, which clamps the voltage across first resonant capacitor 212 as depicted in the time period T4.

With snubber 214 active during the time period T4, snubber 214 dissipates energy flowing through turn-off circuit 110, and the current through auxiliary thyristors 202, 208 and resonant inductor 220 decreases until a zero-crossing current occurs for auxiliary thyristors 202, 208. The voltage across load 108 also decreases. After current 116 exhibits a zero-crossing current, the resonant current through turn-off circuit 110 may be interrupted after a brief reverse recovery current is applied to auxiliary thyristors 202, 208 when they are reverse biased, which deactivates turn-off circuit 110.

Although the above discussion has been made with respect to a positive half-cycle for current 116 when thyristor 102 is conducting, a similar process occurs for a negative half-cycle for current 116 when thyristor 104 is conducting, with the difference being that auxiliary thyristors 204, 206 are conducting during a turn-off process during a negative half-cycle for current 116 rather than auxiliary thyristors 202, 208 as discussed for the positive half-cycle for current 116. The operation of auxiliary transistor 210, first resonant capacitor 212, second resonant capacitor 216, snubber 214, and resonant inductor 220 is similar when commutating current away from thyristor 104 to turn-off circuit 110 as previously described above for thyristor 102.

The above example is applicable to both unidirectional and bidirectional current system that can utilize other types of power, including direct current and multi-phase current applications. In addition, instead of having both thyristors 102, 104 as depicted in FIGS. 1 and 2, switching apparatus 100, 200 some embodiments (e.g., Direct Current (DC) embodiments) include only a single thyristor 102. In DC embodiments, rather than having a first pair of auxiliary thyristors 202, 208 and a second pair of auxiliary thyristors 204, 206 forming a selectable bridge circuit based on the polarity of current 116, turn-off circuit 110 includes a single pair of auxiliary thyristors 202, 208 in order to commutate the current away from a single thyristor 102.

Figure 4:
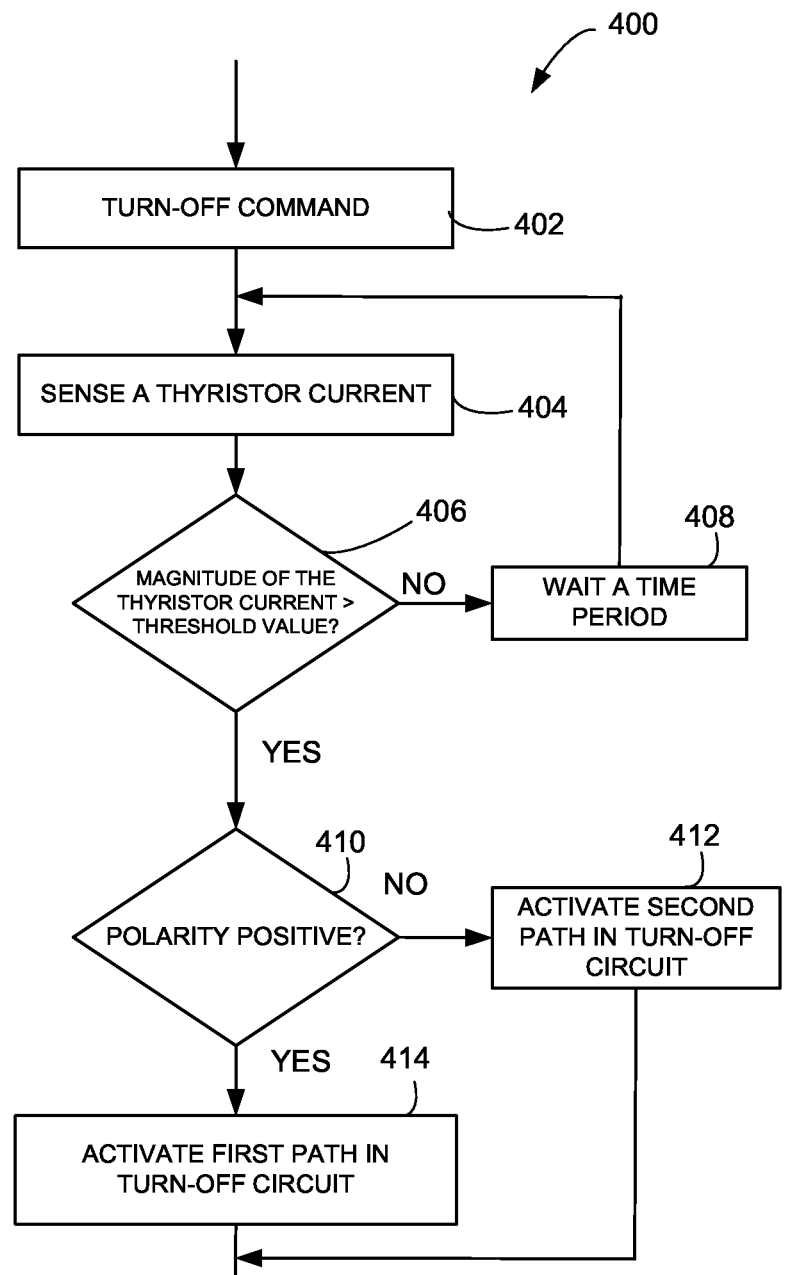
FIG. 4 is flow chart of a method of operating a solid-state switching apparatus in an example embodiment.

FIG. 4 is a flow chart of method 400 of operating a solid-state switching apparatus in an example embodiment. Method 400 will be discussed with respect to switching apparatus 100, 200, although method 400 may be performed by other systems or devices, not shown. The steps of the methods described herein are not all inclusive, and the methods may include other steps, not shown. Further, the steps may be performed in a different order.

Consider that switching apparatus 100, 200 are operating, and that source 106 is coupled to load 108 via thyristors 102, 104. During a positive half-cycle of current 116, thyristor 102 is conducting. During a negative half-cycle of current 116, thyristor 104 is conducting. Turn-off circuit 110 is off (e.g., e.g., auxiliary thyristors 202, 204, 206, 208, and auxiliary transistor 210 are off). A turn-off command is generated by switching apparatus 100, 200 or is received by switching apparatus 100, 200 for disconnecting source 106 from load 108 (see step 402). For example, switching apparatus 100, 200 may receive a turn-off command from another device, and/or switching apparatus 100, 200 may generate the turn-off command in response to determining a power quality issue with source 106, a short circuit at load 108, or some other trigger. In response to the turn-off command, control circuit 112 begins a process to disconnect source 106 from load 108 in an expedient manner using turn-off circuit 110.

Control circuit 112 utilizes current sensor 114 to sense current 116 flowing between source 106 and load 108 through thyristors 102, 104 (see step 404). With turn-off circuit 110 off (e.g., first path 118 and second path 120 are off), current 116 represents the magnitude and polarity that is flowing through either thyristor 102 or thyristor 104. However, in order to ensure that turn-off circuit 110 can commutate current 116 away from thyristors 102, 104 quickly in order to disconnect source 106 from load 108, the appropriate first path 118 or second path 120 of turn-off circuit 110 is selected depending on whether thyristor 102 is conducting current 116 or thyristor 104 is conducting current 116. An incorrect selection may cause up to a half-cycle of current 116 to flow before turn-off starts, which is undesirable.

Control circuit 112 determines if a magnitude of current 116 is greater than a threshold value (see step 406). If the magnitude is less than the threshold value, then control circuit 112 waits a time period (see step 408) and re-evaluates the magnitude of current 116. For example, current 116 may be close to a zero-crossing and it may be difficult to determine whether thyristor 102 is conducting current 116 or thyristor 104 is conducting current 116. Therefore, in order to ensure that one of the correct paths 118, 120 in turn-off circuit 110 is selected to commutate current 116, control circuit 112 waits until the magnitude of current 116 is greater than the threshold value to ensure that a proper determination can be made.

If control circuit 112 determines that the magnitude of current 116 is greater than the threshold value, either immediately or after waiting the time period, then control circuit 112 next determines whether current 116 is positive or negative (see step 410). A positive value of current 116 indicates that thyristor 102 is conducting current 116, and a negative value of current 116 indicates that thyristor 104 is conducting current 116. If control circuit 112 determines that current 116 is negative, then thyristor 104 is conducting current 116 and control circuit 112 activates second path 120 of turn-off circuit 110 to commutate current 116 and quickly turn off thyristor 104 to disconnect source 106 from load 108 (see step 412). The use of second path 120 of turn-off circuit 110 has been previously described with respect to auxiliary thyristors 204, 206, auxiliary transistor 210, snubber 214, resonant capacitors 212, 216, and resonant inductor 220 of FIG. 2.

If control circuit 112 determines that current 116 is positive, then thyristor 102 is conducting current 116 and control circuit 112 activates first path 118 of turn-off circuit 110 to commutate current 116 and quickly turn off thyristor 102 to disconnect source 106 from load 108 (see step 414). The use of first path 118 of turn-off circuit 110 has been previously described with respect to auxiliary thyristors 202, 208, auxiliary transistor 210, snubber 214, resonant capacitors 212, 216, and resonant inductor 220 of FIG. 2.

In some embodiments, control circuit 112 removes the gating signals $G_{m1}$, $G_{m2}$ from thyristors 102, 104, respectively, in response to determining that the magnitude of current 116 is greater than the threshold value, as part of the turn-off process for switching apparatus 100. The gating signals $G_{m1}$, $G_{m2}$ may be removed by control circuit 112 prior to determining the polarity of current 116 in some embodiments. In other embodiments, control circuit 112 removes the gating signals $G_{m1}$, $G_{m2}$ prior to determining the magnitude of current 116. Removing the gating signals $G_{m1}$, $G_{m2}$ at different points in the turn-off process can speed up the process, as discussed below.

Figure 5:
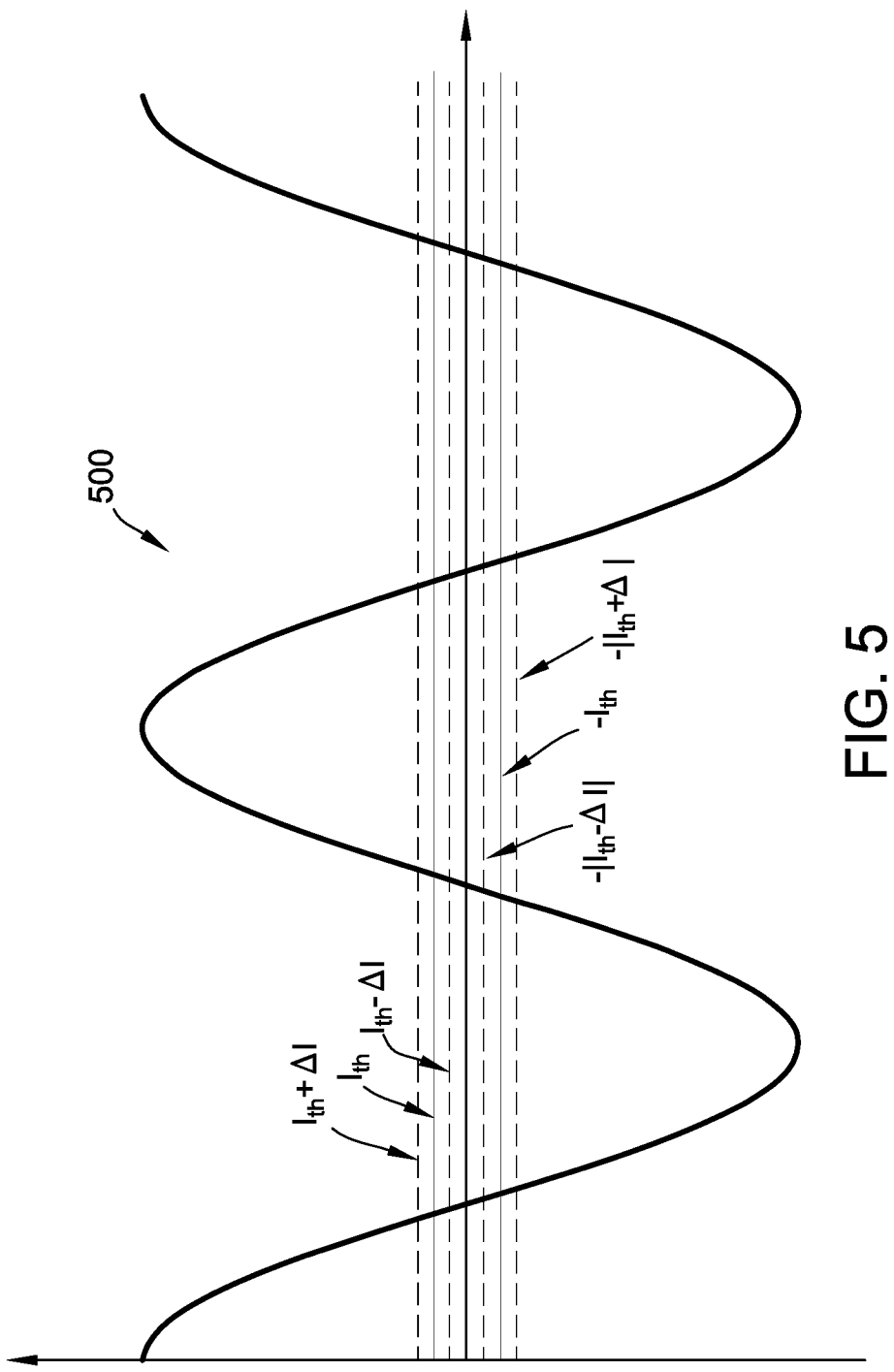
FIG. 5 depicts an Alternating Current (AC) waveform for a load current in an example embodiment.

FIG. 5 depicts an AC waveform 500 for current 116 in an example embodiment. AC waveform 500 illustrates both a positive threshold $I_{th}$ and a negative threshold $-I_{th}$, along with their associated measurement tolerances $+/-\Delta I$.

Figure 6:
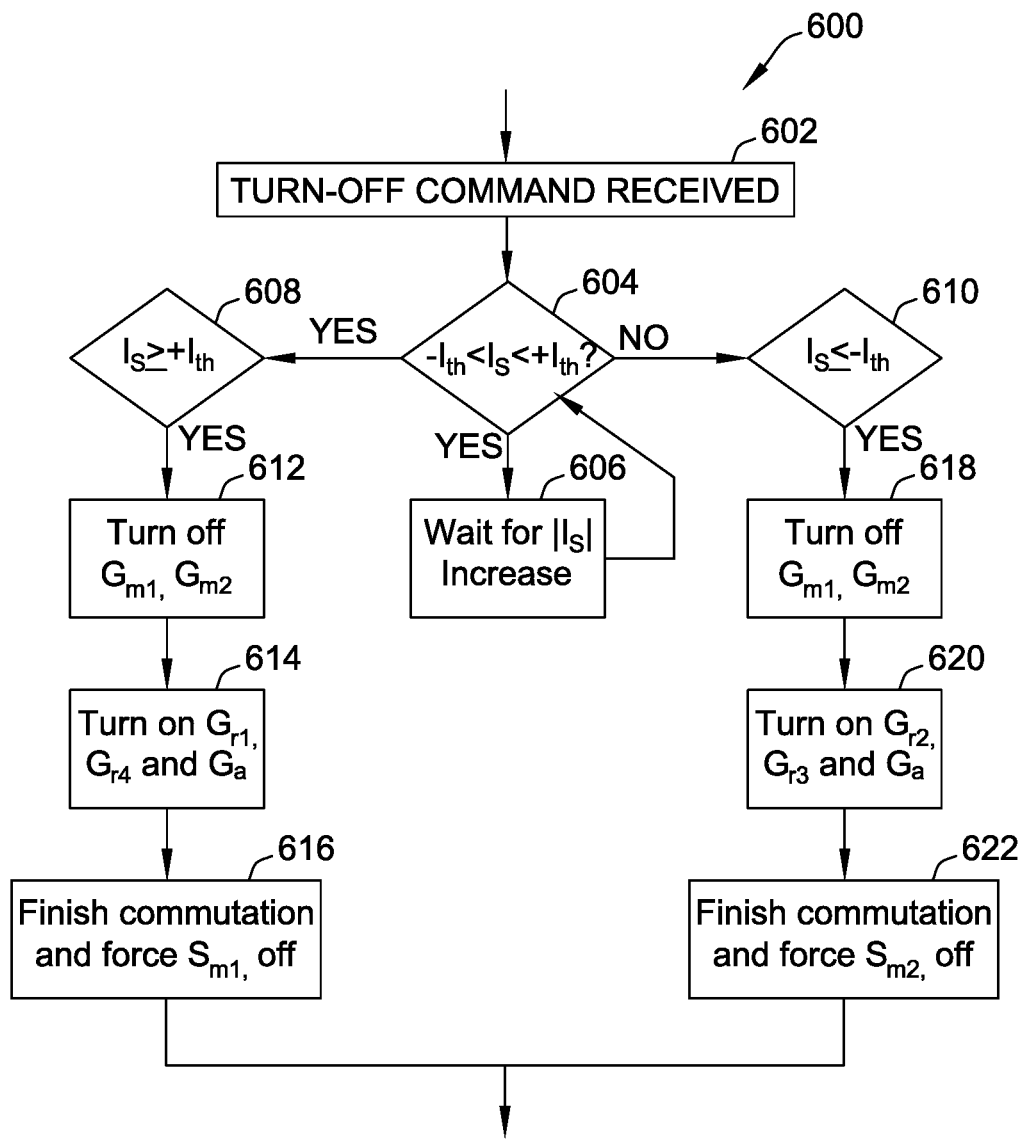
FIG. 6 is flow chart of another method of operating a solid-state switching apparatus in an example embodiment.

FIG. 6 is a flow chart of another method 600 of operating a solid-state switching apparatus in an example embodiment. Method 600 will be discussed with respect to switching apparatus 100, 200, although method 600 may be performed by other systems or devices, not shown. To begin the turn-off process, a turn-off command is received by switching apparatus 100, 200 (see step 602). Control circuit 112 determines whether the amplitude of current 116 ($I_s$) is less than the positive threshold $I_{th}$ or greater than the negative threshold $-I_{th}$ (see step 604). If the amplitude of current 116 ($I_s$) is less than the positive threshold $I_{th}$ or greater than the negative threshold $-I_{th}$, then control circuit 112 waits (see step 606) for the magnitude of current 116 ($I_s$) to increase until the amplitude of current 116 ($I_s$) is either greater than or equal to the positive threshold $I_{th}$ (see step 608) or less than or equal to the negative threshold $-I_{th}$ (see step 610).

When the amplitude of current 116 ($I_s$) is greater than or equal to the positive threshold $I_{th}$, then current 116 ($I_s$) is positive and thyristor 102 ($S_{m1}$) is conducting current 116 ($I_s$). Control circuit 112 turns off the gating signals $G_{m1}$, $G_{m2}$ for thyristors 102 ($S_{m1}$), 104 ($S_{m2}$), respectively (see step 612). Control circuit 112 also turns on auxiliary thyristors 202 ($G_{r1}$), 208 ($G_{r4}$) and auxiliary transistor 210 ($G_a$) of turn-off circuit 110 to begin commutating current 116 ($I_s$) away from thyristor 102 ($S_{m1}$) (see step 614). The turn-off process continues as previously described for first path 118 of turn-off circuit 110 until commutation of current 116 ($I_s$) is complete and thyristor 102 ($S_{m1}$) is forced off (see step 616).

When the amplitude of current 116 ($I_s$) is less than or equal to the negative threshold $-I_{th}$, then current 116 ($I_s$) is negative and thyristor 104 ($S_{m2}$) is conducting current 116 ($I_s$). Control circuit 112 turns off the gating signals $G_{m1}$, $G_{m2}$ for thyristors 102 ($S_{m1}$), 104 ($S_{m2}$), respectively (see step 618). Control circuit 112 also turns on auxiliary thyristors 204 ($G_{r2}$), 206 ($G_{r3}$) and auxiliary transistor 210 ($G_a$) of turn-off circuit 110 to begin commutating current 116 ($I_s$) away from thyristor 104 ($S_{m2}$) (see step 620). The turn-off process continues as previously described for second path 120 of turn-off circuit 110 until commutation of current 116 ($I_s$) is complete and thyristor 104 ($S_{m2}$) is forced off (see step 622). Using method 600, the maximum time to interrupt current 116 ($I_s$) is:

$$T_w = \frac{1}{\pi \cdot f} \cdot \arcsin \frac{I_{th}}{\sqrt{2} \cdot I_s}$$

where f is the system frequency and $I_s$ is the root mean square (rms) value of the sinusoidal current through thyristors 102, 104.

Figure 7:
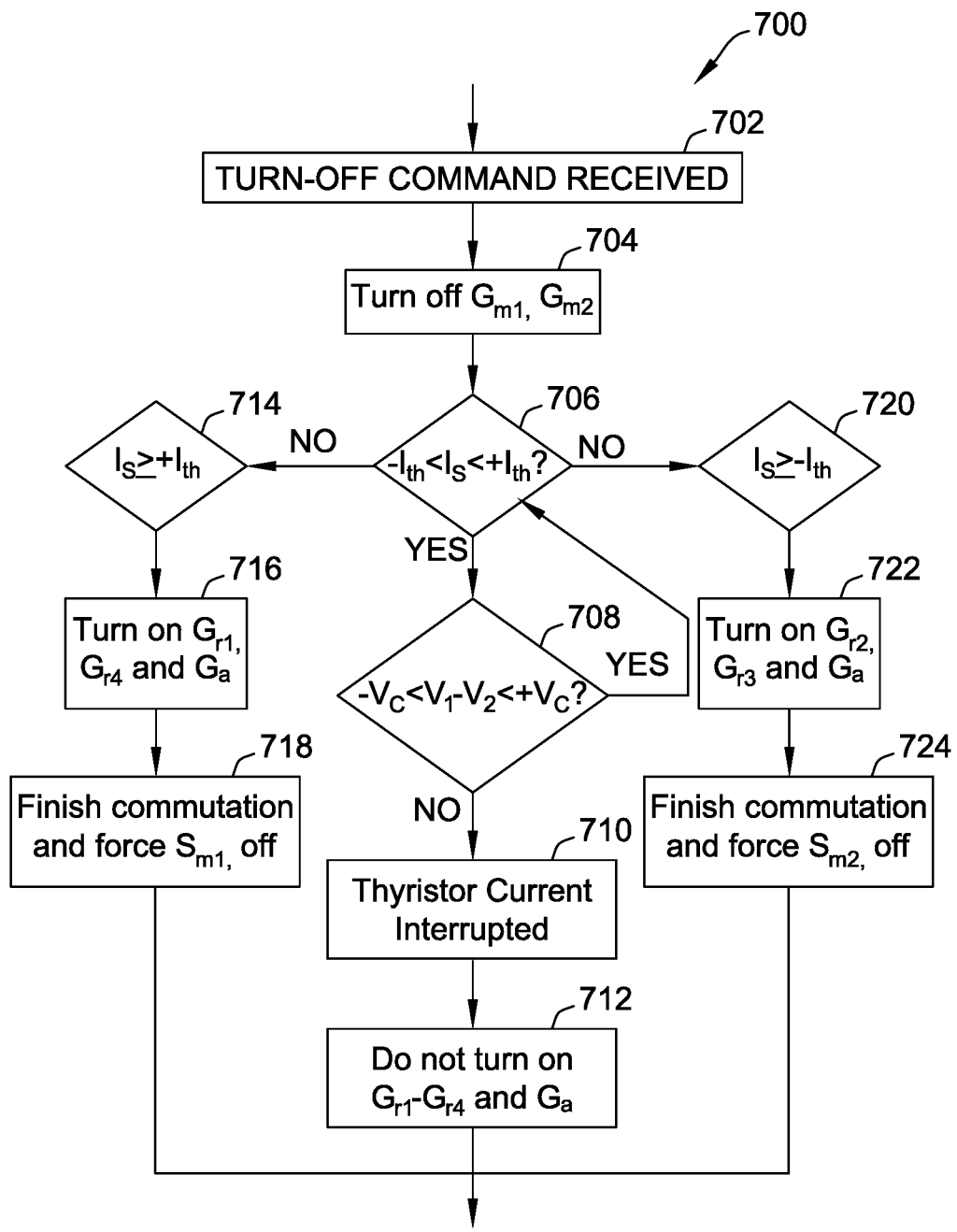
FIG. 7 is flow chart of another method of operating a solid-state switching apparatus in an example embodiment.

FIG. 7 is a flow chart of another method 700 of operating a solid-state switching apparatus in an example embodiment. Method 700 will be discussed with respect to switching apparatus 100, 200, although method 700 may be performed by other systems or devices, not shown. To begin the turn-off process, a turn-off command is received by switching apparatus 100, 200 (see step 702). Control circuit 112 turns off the gating signals $G_{m1}$, $G_{m2}$ immediately for thyristors 102 ($S_{m1}$), 104 ($S_{m2}$), respectively (see step 704), and determines whether the amplitude of current 116 ($I_s$) is less than the positive threshold $I_{th}$ or greater than the negative threshold $-I_{th}$ (see step 706). If the amplitude of current 116 ($I_s$) is less than the positive threshold $I_{th}$ or greater than the negative threshold $-I_{th}$, then two scenarios are possible. In one scenario, current 116 ($I_s$) is at a point before zero-crossing and continues to decrease towards zero, and thyristors 102 ($S_{m1}$), 104 ($S_{m2}$) will turn off by themselves because current 116 ($I_s$) will soon fall below the holding current for thyristors 102 ($S_{m1}$), 104 ($S_{m2}$) (recall that control circuit 112 turned off the gating signals $G_{m1}$, $G_{m2}$ immediately for thyristors 102 ($S_{m1}$), 104 ($S_{m2}$) when the turn-off command was received). In another scenario, current 116 ($I_s$) is at a point after zero-crossing and continues to increase, and removing the gating signals $G_{m1}$, $G_{m2}$ from thyristors 102 ($S_{m1}$), 104 ($S_{m2}$) is not sufficient to turn off thyristors 102 ($S_{m1}$), 104 ($S_{m2}$) quickly (e.g., before the next zero-crossing for current 116 ($I_s$)) without the use of turn-off circuit 110.

Control circuit 112 determines if the voltage difference across thyristors 102 ($S_{m1}$), 104 ($S_{m2}$) ($V_1-V_2$ in FIG. 2) is less than a positive voltage threshold $V_c$ or greater than a negative voltage threshold $V_c$ (see step 708). If the voltage difference across thyristors 102 ($S_{m1}$), 104 ($S_{m2}$) ($V_1-V_2$ in FIG. 2) is less than the positive voltage threshold $+V_c$ or greater than the negative voltage threshold $-V_c$, then processing returns to step 706. If the voltage difference across thyristors 102 ($S_{m1}$), 104 ($S_{m2}$) ($V_1-V_2$ in FIG. 2) is not less than the positive voltage threshold $V_c$ or greater than the negative voltage threshold $V_c$, then current 116 ($I_s$) has been interrupted (see step 710) and control circuit 112 does not turn on auxiliary thyristors 202 ($G_{r1}$), 204 ($G_{r2}$), 206 ($G_{r3}$), 208 ($G_{r4}$) and auxiliary transistor 210 ($G_a$) (see step 710).

Returning to step 706, when current 116 ($I_s$) is greater than or equal to the positive threshold $I_{th}$ (see step 714), then current 116 ($I_s$) is positive and thyristor 102 ($S_{m1}$) is conducting current 116 ($I_s$). Control circuit 112 turns on auxiliary thyristors 202 ($G_{r1}$), 208 ($G_{r4}$), and auxiliary transistor 210 ($G_a$) of turn-off circuit 110 to begin commutating current 116 ($I_s$) away from thyristor 102 ($S_{m1}$) (see step 716). The turn-off process continues as previously described for first path 118 of turn-off circuit 110 until commutation of current 116 ($I_s$) is complete and thyristor 102 ($S_{m1}$) is forced off (see step 718).

When current 116 ($I_s$) is less than or equal to the negative threshold $-I_{th}$ (see step 720), then current 116 ($I_s$) is negative and thyristor 104 ($S_{m2}$) is conducting current 116 ($I_s$). Control circuit 112 turns on auxiliary thyristors 204 ($G_{r2}$), 206 ($G_{r3}$), and auxiliary transistor 210 ($G_a$) of turn-off circuit 110 to begin commutating current 116 ($I_s$) away from thyristor 104 ($S_{m2}$) (see step 722). The turn-off process continues as previously described for second path 120 of turn-off circuit 110 until commutation of current 116 ($I_s$) is complete and thyristor 104 ($S_{m2}$) is forced off (see step 724). Using method 700, the maximum time to interrupt current 116 ($I_s$) is:

$$T_w = \frac{1}{2 \cdot \pi \cdot f} \cdot \arcsin \frac{I_{th}}{\sqrt{2} \cdot I_s}$$

where f is the system frequency and $I_s$ is the root mean square (rms) value of the sinusoidal current through thyristors 102, 104. The process in method 700 results in a turn-off time that is half of method 600.

An example technical effect of the apparatus and methods described herein includes one or more of: (a) providing fast turn-off capability to thyristors; (b) providing a low-cost add-on turn-off circuit option for existing thyristor drive circuits; (c) the turn-off circuit does not conduct during normal operation, and does not generate a power loss during normal operation; and (d) the turn-off circuit does not require high capacitance values to operate, thereby mitigating the use of large capacitor banks; (e) the resonant inductance in the turn-off circuit is small and can utilize the parasitic inductance in existing power cables.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A solid-state switching apparatus, comprising:
   a pair of anti-parallel thyristors;
   a quasi-resonant turn-off circuit coupled in parallel with the pair of anti-parallel thyristors, wherein the quasi-resonant turn-off circuit comprises a first selectively conductive path and a second selectively conductive path;
   a sensor configured to sense a thyristor current conducted by at least one of the pair of anti-parallel thyristors; and
   a control circuit configured to:
      receive the sensed thyristor current from the sensor;
      determine a magnitude of the sensed thyristor current and a polarity of the sensed thyristor current;
      wait, in response to determining that the magnitude is less than a threshold value, for a time period;
      reevaluate the magnitude of the sensed thyristor current and the polarity of the sensed thyristor current after the time period has elapsed; and
      activate, in response to determining after the time period has elapsed that the magnitude is greater than the threshold value, one of the first selectively conductive path and the second selectively conductive path based on the polarity to commutate and interrupt the thyristor current.

2. The solid-state switching apparatus of claim 1, wherein:
   the control circuit is further configured to remove gating signals from the pair of anti-parallel thyristors in response to determining that the magnitude of the sensed thyristor current is greater than the threshold value.

3. The solid-state switching apparatus of claim 1, wherein:
   the control circuit is further configured to remove gating signals from the pair of anti-parallel thyristors prior to determining that the magnitude of the sensed thyristor current is greater than the threshold value.

4. The solid-state switching apparatus of claim 3, wherein:
   the control circuit is further configured to remove the gating signals from the pair of anti-parallel thyristors prior to sensing the thyristor current.

5. The solid-state switching apparatus of claim 1, wherein:
   the quasi-resonant turn-off circuit comprises a first auxiliary thyristor, a second auxiliary thyristor, a third auxiliary thyristor, a fourth auxiliary thyristor, and an auxiliary transistor,
   the first selectively conductive path comprises the first auxiliary thyristor, the fourth auxiliary thyristor, and the auxiliary transistor, and
   the second selectively conductive path comprises the second auxiliary thyristor, the third auxiliary thyristor, and the auxiliary transistor.

6. The solid-state switching apparatus of claim 5, wherein:
   the control circuit is configured to activate the first auxiliary thyristor, the fourth auxiliary thyristor, and the auxiliary transistor in response to determining that the magnitude of the sensed thyristor current is greater than the threshold value and the polarity of the sensed thyristor current is positive.

7. The solid-state switching apparatus of claim 5, wherein:
   the control circuit is configured to activate the second auxiliary thyristor, the third auxiliary thyristor, and the auxiliary transistor in response to determining that the magnitude of the sensed thyristor current is greater than the threshold value and the polarity of the sensed thyristor current is negative.

8. The solid-state switching apparatus of claim 1, wherein:
   the control circuit is further configured to wait, in response to determining that the magnitude is less than the threshold value, until the magnitude is greater than the threshold value.

9. A method of operating a solid-state switching apparatus, the method comprising:
   sensing a thyristor current conducted by at least one of a pair of anti-parallel thyristors, the pair of anti-parallel thyristors being coupled in parallel with a quasi-resonant turn-off circuit, wherein the quasi-resonant turn-off circuit includes a first selectively conductive path and a second selectively conductive path;
   determining a magnitude of the sensed thyristor current and a polarity of the sensed thyristor current;
   waiting, in response to determining that the magnitude is less than a threshold value, for a time period;
   reevaluating the magnitude of the sensed thyristor current and the polarity of the sensed thyristor current after the time period has elapsed; and
   activating, in response to determining after the time period has elapsed that the magnitude is greater than the threshold value, one of the first selectively conductive path and the second selectively conductive path based on the polarity to commutate and interrupt the thyristor current.

10. The method of claim 9, further comprising:
    removing gating signals from the pair of anti-parallel thyristors in response to determining that the magnitude of the sensed thyristor current is greater than the threshold value.

11. The method of claim 9, further comprising:
removing gating signals from the pair of anti-parallel thyristors prior to determining the magnitude of the sensed thyristor current and the polarity of the sensed thyristor current.

12. The method of claim 11, further comprising:
removing the gating signals from the pair of anti-parallel thyristors prior to sensing the thyristor current.

13. The method of claim 9, wherein:
the quasi-resonant turn-off circuit includes a first auxiliary thyristor, a second auxiliary thyristor, a third auxiliary thyristor, a fourth auxiliary thyristor, and an auxiliary transistor,
the first selectively conductive path includes the first auxiliary thyristor, the fourth auxiliary thyristor, and the auxiliary transistor, and
the second selectively conductive path includes the second auxiliary thyristor, the third auxiliary thyristor, and the auxiliary transistor.

14. The method of claim 13, wherein:
activating one of the first selectively conductive path and the second selectively conductive path comprises:
activating the first auxiliary thyristor, the fourth auxiliary thyristor, and the auxiliary transistor in response to determining that the magnitude of the sensed thyristor current is greater than the threshold value and the polarity of the sensed thyristor current is positive.

15. The method of claim 13, wherein:
activating one of the first selectively conductive path and the second selectively conductive path comprises:
activating the second auxiliary thyristor, the third auxiliary thyristor, and the auxiliary transistor in response to determining that the magnitude of the sensed thyristor current is greater than the threshold value and the polarity of the sensed thyristor current is negative.

16. A solid-state switching apparatus, comprising:
a first thyristor that selectively couples a source with a load to conduct a load current;
a second thyristor anti-parallel to the first thyristor, wherein the second thyristor selectively couples the source with the load to conduct the load current;
a quasi-resonant turn-off circuit coupled in parallel with the first thyristor and the second thyristor, wherein the quasi-resonant turn-off circuit comprises a first selectively conductive path configured to commutate and interrupt the load current when the load current is conducted by the first thyristor, and wherein the quasi-resonant turn-off circuit further comprises a second selectively conductive path configured to commutate and interrupt the load current when the load current is conducted by the second thyristor;
a sensor configured to sense the load current; and
a control circuit configured to:
determine, using the sensor, a magnitude of the load current and a polarity of the load current;
wait, in response to determining that the magnitude is less than a threshold value, for a time period;
reevaluate the magnitude of the load current and the polarity of the load current after the time period has elapsed; and
in response to determining after the time period has elapsed that the magnitude of the load current is greater than the threshold value:
activate the first selectively conductive path to commutate and interrupt the load current conducted by the first thyristor in response to the polarity of the load current being positive; and
activate the second selectively conductive path to commutate and interrupt the load current conducted by the second thyristor in response to the polarity of the load current being negative.

17. The solid-state switching apparatus of claim 16, wherein:
the quasi-resonant turn-off circuit comprises a first auxiliary thyristor, a second auxiliary thyristor, a third auxiliary thyristor, a fourth auxiliary thyristor, and an auxiliary transistor,
the first selectively conductive path comprises the first auxiliary thyristor, the fourth auxiliary thyristor, and the auxiliary transistor, and
the second selectively conductive path comprises the second auxiliary thyristor, the third auxiliary thyristor, and the auxiliary transistor.

18. The solid-state switching apparatus of claim 16, wherein:
the control circuit is further configured to remove gating signals from the first thyristor and the second thyristor in response to determining that the magnitude of the load current is greater than the threshold value.

19. The solid-state switching apparatus of claim 16, wherein:
the control circuit is further configured to remove gating signals from the first thyristor and the second thyristor prior to determining that the magnitude of the load current is greater than the threshold value.

20. The solid-state switching apparatus of claim 16, wherein:
the control circuit is further configured to remove gating signals from first the thyristor and the second thyristor prior to sensing the load current.

* * * * *